(12) United States Patent
Collier et al.

(10) Patent No.: US 6,680,639 B1
(45) Date of Patent: Jan. 20, 2004

(54) PHASE SHIFTING ARRANGEMENT FOR GENERATING MUTUALLY ORTHOGONAL SIGNALS

(75) Inventors: James Digby Yarlet Collier, Cambridgeshire (GB); Justin David John Penfold, Suffolk (GB)

(73) Assignee: Cambridge Silicon Radio Ltd., Cambridge (GB)

( * ) Notice: Subject to any disclaimer, the term of this patent is extended or adjusted under 35 U.S.C. 154(b) by 11 days.

(21) Appl. No.: 10/048,714

(22) PCT Filed: Jul. 18, 2000

(86) PCT No.: PCT/GB00/02762
§ 371 (c)(1),
(2), (4) Date: Jun. 11, 2002

(87) PCT Pub. No.: WO01/10029
PCT Pub. Date: Feb. 8, 2001

(30) Foreign Application Priority Data

Aug. 3, 1999 (GB) .............................................. 9918317

(51) Int. Cl.[7] .............................................. H03H 11/16
(52) U.S. Cl. ........................ 327/238; 327/245; 327/254
(58) Field of Search ................................ 327/231, 232, 327/235–237, 238, 242–245, 246, 247, 254–259, 155, 156–159, 161, 355, 359; 375/371, 373–376; 331/DIG. 2, 34; 330/294, 109

(56) References Cited

U.S. PATENT DOCUMENTS

| 5,663,665 | A |   | 9/1997 | Wang et al. ................ 327/3 |
|---|---|---|---|---|
| 5,850,163 | A | * | 12/1998 | Drost et al. ................ 331/115 |
| 5,877,643 | A | * | 3/1999 | Drogi ........................ 327/256 |
| 6,078,200 | A | * | 6/2000 | Miyano ...................... 327/142 |
| 6,232,844 | B1 | * | 5/2001 | Talaga, Jr. .................. 331/57 |

FOREIGN PATENT DOCUMENTS

| EP | 0 703 673 A2 A3 |   | 3/1996 |
|---|---|---|---|
| WO | WO 92/11704 A1 |   | 7/1992 |
| WO | WO 92/11704 | * | 7/1992 |

* cited by examiner

*Primary Examiner*—Minh Nguyen
(74) *Attorney, Agent, or Firm*—Rothwell, Figg, Ernst & Manbeck

(57) ABSTRACT

The present invention is directed to a phase shifting arrangement for generating a set of mutually orthogonal signals. In one aspect, the invention provides a system that includes a phase shifting unit for receiving an input signal. The phase shifting unit includes a first phase shift circuit for generating a first output signal phase-shifted by a first amount with respect to the input signal, a second phase shift circuit for generating a second output signal phase-shifted by a second amount with respect to the input signal, and a third phase shift circuit for generating a third output signal phase-shifted by a third amount with respect to the input signal.

12 Claims, 2 Drawing Sheets

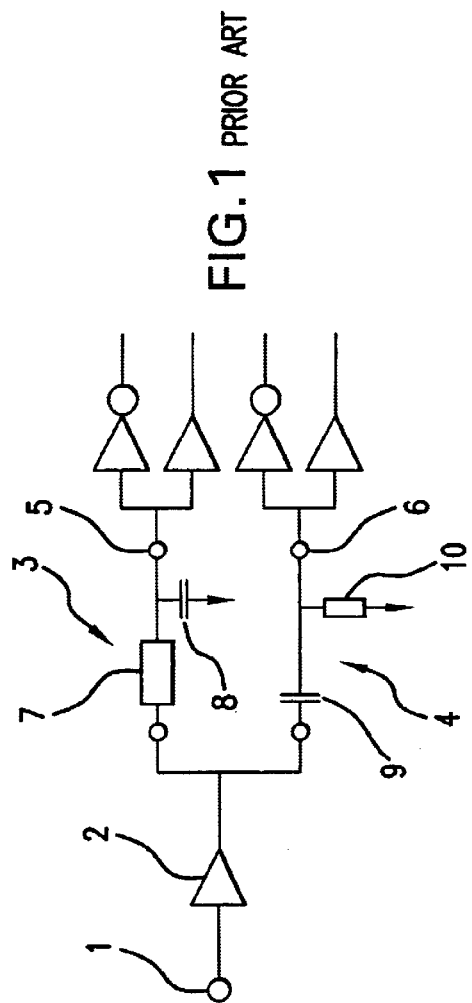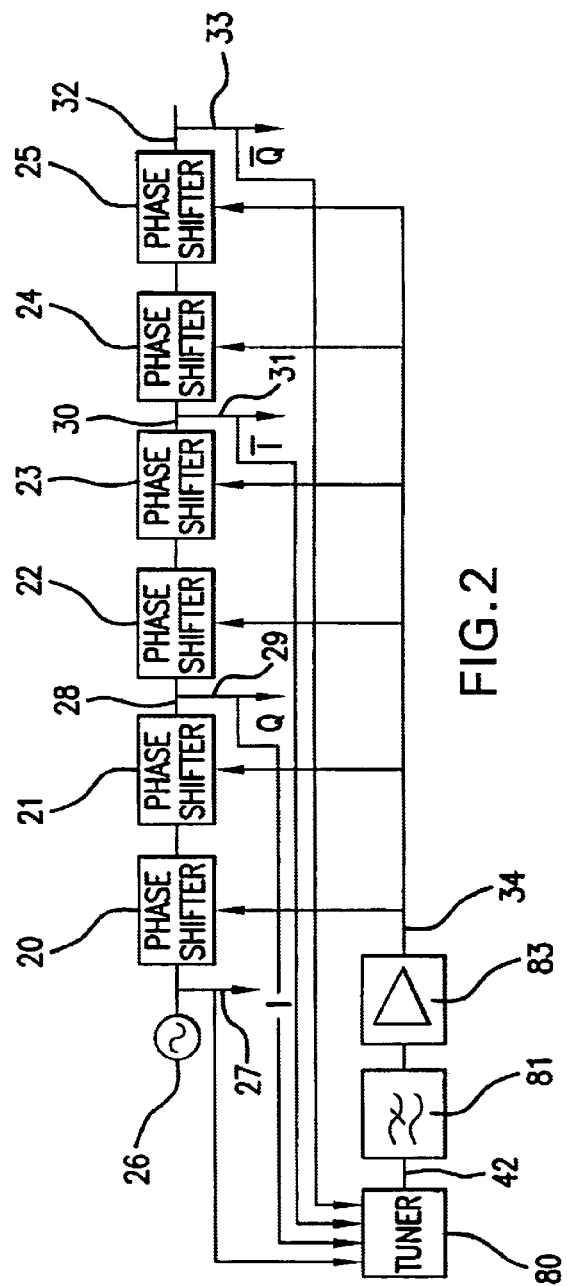

PHASE SHIFTING ARRANGEMENT FOR GENERATING MUTUALLY ORTHOGONAL SIGNALS

This invention relates to circuits for phase shifting, and the adjustment of such circuits.

BACKGROUND OF THE INVENTION

There are numerous applications of circuits for phase shifting. One common application is in radio transceivers. Many radio architectures, especially in low or zero IF receivers or transmitters employ complex mixers. In a typical configuration the mixer is arranged to receive and mix two input signals which are at the same frequency (usually the local oscillator frequency) but in quadrature, i.e. 90° out of phase. It is important that the signals are precisely in quadrature—otherwise spurious "image" signals are generated. A 90° phase shifting circuit could be used to generate one of the quadrature signals from the other. FIG. 1 shows an example of a possible circuit.

In the circuit of FIG. 1 the signal generated by the local oscillator is received at node 1 and buffered by unit gain amplifier 2. The signal then passes through two parallel arms 3, 4 to nodes 5, 6 respectively. Arm 3 contains resistor 7 and is tied to ground by capacitor 8. Arm 4 contains capacitor 9 and is tied to ground by resistor 10. The RC networks in arms 3 and 4 act as phase shifting circuits. The values of the R and C components 7 to 10 are selected so that arm 3 causes a −45° phase shift of the signal from amplifier 2 and arm 4 causes a +45° phase shift of the signal from amplifier 2. Thus the signals at nodes 5 and 6 are in quadrature. The signals from each node 5, 6 then pass to respective unit gain amplifiers 11, 12 and inverters 13, 14 to generate I (in-phase) and Q (quadrature) and $\bar{I}$ (not in-phase) and $\bar{Q}$ (not quadrature) signals respectively for use by the mixer(s) of the transceiver.

The characteristics of the phase shifting circuit are sensitively dependant on the values of the R and C components 7 to 10. Therefore, it is difficult to ensure that the phase shifting circuit is precise enough to avoid unacceptable image signals in the output from the mixer. If the capacitors 8 and 9 do not have identical values then the I and Q signals are unlikely to be orthogonal. Variations in the absolute values of the components 7 to 10 affects the amplitude of the output signals, and where two mixers are being used this amplitude difference can cause their gains to differ, which reduces the image rejection performance.

Another approach to generating the quadrature signals is to use a divide by four circuit. A signal is first generated at four times the local oscillator frequency. This is passed to the divide by four circuit and the quadrature outputs are taken from different points in the divide by four circuit. However, especially in RF applications it is often inconvenient or impossible to generate frequencies as high as four times the local oscillator frequency.

There is thus a need for an improved phase shifting circuit.

SUMMARY OF THE INVENTION

According to the present invention there is provided a phase shifting arrangement for generating a set of mutually orthogonal signals, comprising: a phase shifting unit for receiving an input signal and having a first phase shift circuit for generating a first output signal phase-shifted by a first amount with respect to the input signal, a second phase shift circuit for generating a second output signal phase-shifted by a second amount with respect to the input signal, and a third phase shift circuit for generating a third output signal phase-shifted by a third amount with respect to the input signal; the phase shift caused by each of the first, second and third phase shift circuits being adjustable in response to a feedback signal; and a phase shift adjustment circuit for generating the feedback signal and arranged to receive the first, second and third output signals and a fourth output signal of the same phase as the input signal and thereby generate an error signal dependant on the deviation of the first, second, third and fourth signals from mutual orthogonality; and a feedback circuit arranged to receive the error signal and form the feedback signal in dependence thereon in so as to cause the first, second and third phase shift circuits to, on receiving the feedback signal, generate the first, second and third signals in closer orthogonality to each other and to the input signal.

The first, second and third phase shift circuits are preferably, but not necessarily, of the same type. The first phase shift circuit is suitably arranged to receive the input signal and shift its phase to generate the first output signal. The second phase shift circuit is suitably arranged to receive the first output signal and shift its phase to generate the second output signal. The third phase shift circuit is suitably arranged to receive the second output signal and shift its phase to generate the third output signal. The phase shifts performed by the first, second and third phase shift circuits are preferably the same.

Preferably the phase shifting arrangement forms a feedback loop. Thus, the phase shifting unit and the phase shift adjustment circuit are preferably connected as a feedback loop. Most preferably the loop has a stable state when the phase shifts performed by the first, second and third phase shift circuits are 900°. Preferably each of the first, second and third phase shift circuits comprises a pair of series-coupled phase shifting arrangements capable of performing equal phase shifts. Preferably the phase shifting arrangements each perform a 45° phase shift when the loop has a stable state.

The phase shift adjustment circuit preferably comprises a first complex mixer for receiving and mixing the first, second and third output signals and a signal of the same phase as the input signal to generate the error signal. The phase shift adjustment circuit most preferably also comprises a second complex mixer for receiving and mixing the first, second and third output signals and a signal of the same phase as the input signal, and a combining unit for combining the outputs of the first and second complex mixers to generate the error signal. The two complex mixers preferably have the same circuit arrangement, but receive the first, second, third and fourth signals at different inputs. At its inputs analogous to those at which the first complex mixer receives the first and third output signals the second complex mixer suitably receives the second and fourth output signals.

The phase shifting arrangement may be part of a radio transmitter and/or receiver, which may also comprise a local oscillator for generating the input signal. The input signal and the first, second and third signals may represent 1, Q, $\bar{I}$ and $\bar{Q}$ signals for use by the radio transmitter and/or receiver, suitably in modulation or demodulation of signals received by or to be transmitted by radio.

BRIEF DESCRIPTION OF THE DRAWINGS

The present invention will now be described by way of example, with reference to the accompanying drawings, in which:

FIG. 1 shows a prior art phase shifting circuit;

FIG. 2 shows a schematic diagram of a phase shifting circuit according to the present invention;

DETAILED DESCRIPTION OF THE PREFERRED EMBODIMENTS

Figure 3:
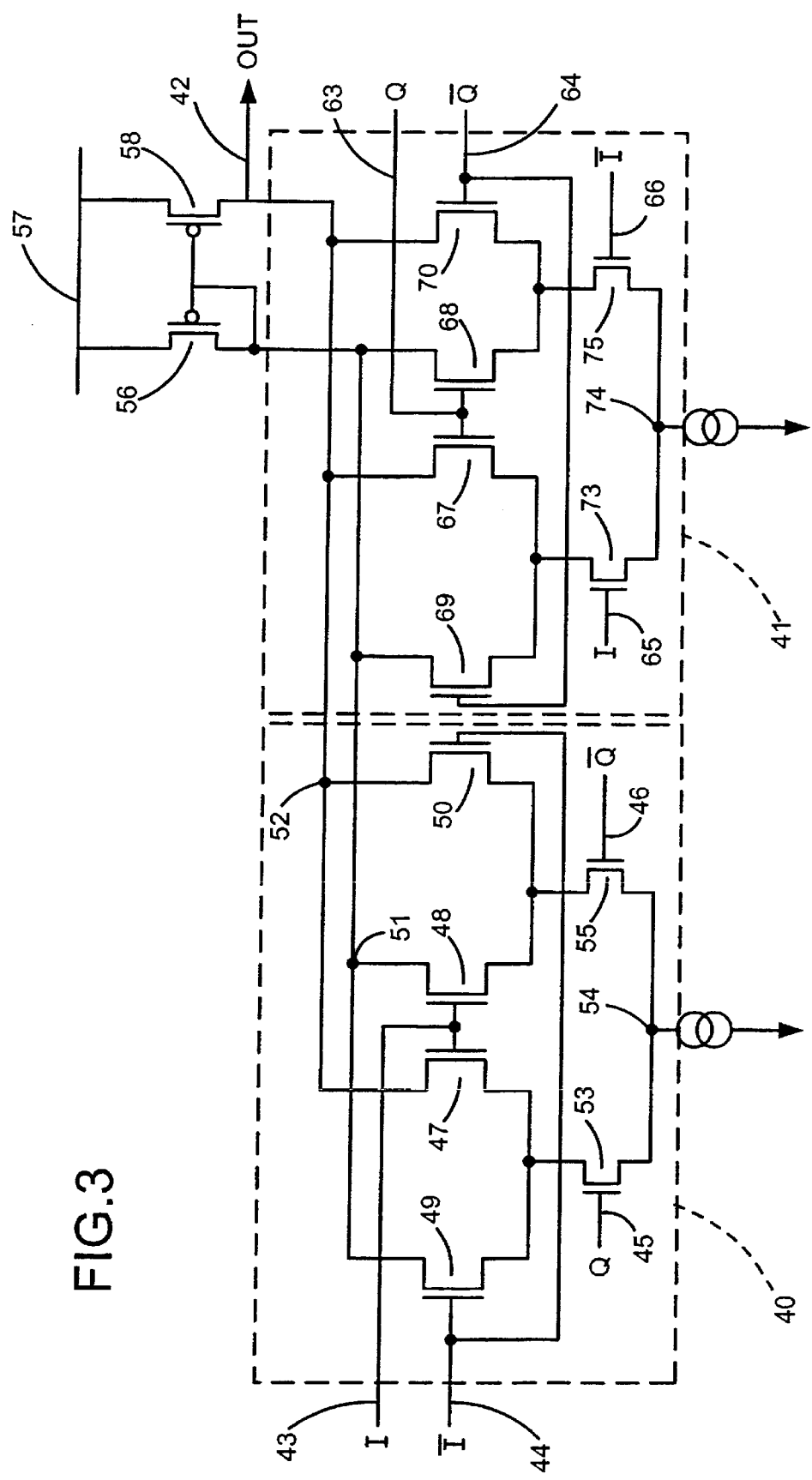
FIG. 3 shows a tuning arrangement for use with the circuit of FIG. 2.

FIG. 2 shows the general arrangement of a phase shifting circuit according to one embodiment of the present invention, implemented as part of a radio transceiver.

The circuit comprises a chain of six 45° phase shifting blocks 20 to 25 connected in series. The blocks are identical, or at least have the same response. Each block receives a signal and outputs a signal having the same frequency as the input signal but shifted in phase to it by +45°. The first block 20 of the chain receives a signal from the local oscillator 26 of the radio transceiver. This signal is tapped to form the I signal at 27. The local oscillator signal is phase shifted by 45° by block 20 and by another 45° by block 21 to generate a signal at 28 that is 90° out of phase from the local oscillator signal. The signal at 28 is tapped to form the Q signal at 29. The signal at 28 is phase shifted by a further 90° by the successive actions of blocks 22 and 23 to generate a signal at 30 which is 180° out of phase from the local oscillator signal and which is tapped to form the $\bar{I}$ signal at 31. The signal at 30 is phase shifted by a further 90° by the successive actions of blocks 24 and 25 to generate a signal at 32 which is 270° out of phase from the local oscillator signal and which is tapped to form the $\bar{Q}$ signal at 33.

The I, Q, $\bar{I}$ and $\bar{Q}$ signals are passed to the mixers of the transceiver for use in the normal way.

Each of the phase shifting blocks 20–25 contains an identical 45° phase shifting circuit. The circuits are designed to have low pass characteristics and to have exactly unit gain at 45° phase shift. The circuits are arranged so that their time constants are electrically tuneable. The phase shifting elements of each phase shifting circuit can consist only of transistors.

Each of the 45° phase shifting blocks 20 to 25 is connected to receive a common tuning signal from 34.

In this way the delay characteristics of the blocks 20–25, and therefore the relative phases of the I, Q, $\bar{I}$ and $\bar{Q}$ signals can be electrically tuned to ensure that the signals are orthogonal. The circuit of FIG. 3 is one example of a circuit that can be used to generate the tuning signal.

The circuit of FIG. 3 comprises two complex mixers shown generally at 40 and 41 whose outputs are added to form output 42.

Mixer 40 has its local oscillator (LO) inputs 43, 44 connected to receive I and $\bar{I}$ signals generated by the circuit of FIG. 2 and its other inputs (which would normally be its RF inputs) 45, 46 connected to receive the Q and $\bar{Q}$ signals generated by the circuit of FIG. 2 (suitably attenuated as required). Input 43 is connected to the gates of transistors 47 and 48. Input 44 is connected to the gates of transistors 49 and 50. The drains of transistors 48 and 49 are connected to node 51. The drains of transistors 47 and 50 are connected to node 52. The sources of transistors 47 and 49 are connected to the drain of transistor 53, whose gate is connected to input 45 and whose source is connected to grounding node 54. The sources of transistors 48 and 50 are connected to the drain of transistor 55, whose gate is connected to input 46 and whose source is connected to grounding node 54. This configuration of transistors to form a double balanced mixer is commonly known as a "Gilbert cell".

Mixer 41 has its local oscillator inputs 63, 64 connected to receive Q and $\bar{Q}$ signals generated by the circuit of FIG. 2 and its other inputs 65, 66 connected to receive the I and $\bar{I}$ signals generated by the circuit of FIG. 2. Input 63 is connected to the gates of transistors 67 and 68. Input 64 is connected to the gates of transistors 69 and 70. The drains of transistors 68 and 69 are connected to node 51. The drains of transistors 69 and 70 are connected to node 52. The sources of transistors 67 and 69 are connected to the drain of transistor 73, whose gate is connected to input 65 and whose source is connected to grounding node 74. The source of transistors 68 and 70 are connected to the drain of transistor 75, whose gate is connected to input 66 and whose source is connected to grounding node 74.

Node 51 is connected to the drain of p-channel transistor 56, whose source is connected to the supply rail 57 and whose gate is coupled back to its drain. The gate of transistor 56 is also connected to the gate of p-channel transistor 58, whose source is connected to the supply rail 57 and whose drain is connected to node 52 and output 42. This configuration of transistors 56 and 58 is commonly known as a "current mirror".

It can be shown that the output OUT of this circuit at 42 is given by:

$$OUT = I^*Q + Q^*I$$

Therefore, if I is taken to be represented by:

$$I = \cos(\omega t)$$

and the phase offset between I and Q (which should ideally be 90°) is represented by (90°+φ) then Q can be represented by:

$$Q = \sin(\omega t + \phi)$$

and the output OUT becomes:

$$OUT = \sin(2\omega t + \phi) + \sin(\phi)$$

which can be low pass filtered to generate an output $OUT_2$ such that:

$$OUT_2 = +\sin(\phi)$$

This signal $OUT_2$ is dependant only on the phase error φ between I and Q.

In FIG. 2 block 80 represents the circuit of FIG. 3 which generates output OUT at 42. That output is low pass filtered by low pass filter 81 to generate signal $OUT_2$ at 82, which is then integrated in a servo amplifier 83 to generate the tuning signal at 34. In practice 81 and 83 are combined, the integral operation providing sufficient low pass filtering. This tuning signal is fed into the phase shifting blocks 20–25 as a feedback signal. The overall effect of the feedback loop is to cause the circuit to minimise sin(φ), so that the phase error φ is held stable at zero, and the phase offsets of the I, Q, $\bar{I}$ and $\bar{Q}$ signals is held correctly. Since the response of the blocks 20–25 is the same a single control signal can be sent to them all to ensure the correct phase relationship of the I, Q, $\bar{I}$ and $\bar{Q}$ signals. If the blocks 20–25 had different responses then the control signal could be modified accordingly for input to each block.

In an ideal situation one of the mixers 40, 41 could be omitted. However, using the two mixers allows any differences in delay between the RF and the LO inputs of the mixers to be cancelled out.

The phase shifting circuit described above could be used in applications other than radio transceivers.

The applicant draws attention to the fact that the present invention may include any feature or combination of features disclosed herein either implicitly or explicitly or any generalisation thereof, without limitation to the scope of any of the present claims. In view of the foregoing description it will be evident to a person skilled in the art that various modifications may be made within the scope of the invention.

What is claimed is:

1. A phase shifting arrangement for generating a set of mutually orthogonal sinusoidal signals, comprising:

a phase shifting unit for receiving a sinusoidal input signal and having a first phase shift circuit for generating a first sinusoidal output signal phase-shifted by a first amount with respect to the sinusoidal input signal, a second phase shift circuit for generating a second sinusoidal output signal phase-shifted by a second amount with respect to the sinusoidal input signal, and a third phase shift circuit for generating a third sinusoidal output signal phase-shifted by a third amount with respect to the sinusoidal input signal; the phase shift caused by each of the first, second and third phase shift circuits being adjustable in response to a feedback signal; and a phase shift adjustment circuit for generating the feedback signal and arranged to receive the first, second and third sinusoidal output signals and a fourth sinusoidal output signal of the same phase as the sinusoidal input signal and thereby generate an error signal dependant on the deviation of the first, second, third and fourth signals from mutual orthogonality; and a feedback circuit arranged to receive the error signal and form the feedback signal in dependence thereon in so as to cause the first, second and third phase shift circuits to, on receiving the feedback signal, generate the first, second and third signals in closer orthogonality to each other and to the sinusoidal input signal, wherein the first, second and third phase shift circuits are of the same type.

2. A phase shifting arrangement as claimed in claim 1, wherein the first phase shift circuit is arranged to receive the sinusoidal input signal and shift its phase to generate the first sinusoidal output signal, the second phase shift circuit is arranged to receive the first sinusoidal output signal and shift its phase to generate the second sinusoidal output signal, and the third phase shift circuit is arranged to receive the second sinusoidal output signal and shift its phase to generate the third sinusoidal output signal.

3. A phase shifting arrangement as claimed in claim 2, wherein the phase shifts performed by the first, second and third phase shift circuits are the same.

4. A phase shifting arrangement as claimed in claim 1, wherein the phase shifting unit and the phase shift adjustment circuit are connected to form a feedback loop.

5. A phase shifting arrangement as claimed in claim 4, wherein the feedback loop is in a stable state when the phase shifts performed by the first, second and third phase shift circuits are 90 degrees.

6. A phase shifting arrangement for generating a set of mutually orthogonal sinusoidal signals, comprising:

a phase shifting unit for receiving a sinusoidal input signal and having a first phase shift circuit for generating a first sinusoidal output signal phase-shifted by a first amount with respect to the sinusoidal input signal, a second phase shift circuit for generating a second sinusoidal output signal phase-shifted by a second amount with respect to the sinusoidal input signal, and a third phase shift circuit for generating a third sinusoidal output signal phase-shifted by a third amount with respect to the sinusoidal input signal; the phase shift caused by each of the first, second and third phase shift circuits being adjustable in response to a feedback signal; and a phase shift adjustment circuit for generating the feedback signal and arranged to receive the first, second and third sinusoidal output signals and a fourth output signal of the same phase as the sinusoidal input signal and thereby generate an error signal dependant on the deviation of the first, second, third and fourth signals from mutual orthogonality; and a feedback circuit arranged to receive the error signal and form the feedback signal in dependence thereon in so as to cause the first, second and third phase shift circuits to, on receiving the feedback signal, generate the first, second and third signals in closer orthogonality to each other and to the sinusoidal input signal, wherein each of the first, second and third phase shift circuits comprises a pair of series-coupled phase shifting arrangements capable of performing equal phase shifts.

7. A phase shifting arrangement as claimed in claim 6, wherein the phase shift adjustment circuit comprises a first complex mixer for receiving and mixing the first, second, third and fourth sinusoidal output signals to generate the error signal.

8. A phase shifting arrangement as claimed in claim 7, wherein the phase shift adjustment circuit comprises a second complex mixer for receiving and mixing the first, second, third and fourth output signals, and a combining unit for combining the outputs of the first and second complex mixers to generate the error signal.

9. A phase shifting arrangement as claimed in claim 8, wherein the complex mixers have the same circuit arrangement, and at its inputs analogous to those at which the first complex mixer receives the first and third output signals the second complex mixer receives the second and fourth output signals.

10. A radio transmitter and/or receiver comprising a phase shifting arrangement as claimed in claim 6.

11. A radio transmitter and/or receiver as claimed in claim 10, comprising a local oscillator for generating the sinusoidal input signal to the phase shifting unit.

12. A radio transmitter and/or receiver as claimed in claim 10, wherein the sinusoidal input signal and the first, second and third signals represent I, Q, I' and Q' signals for use by the radio transmitter and/or receiver.

* * * * *